United States Patent
Takahashi

(10) Patent No.: US 6,313,188 B1
(45) Date of Patent: *Nov. 6, 2001

(54) PHOTOCATIONICALLY POLYMERIZABLE COMPOSITION COMPRISING A POLYCYCLIC AROMATIC COMPOUND

(75) Inventor: Eiji Takahashi, Ichihara (JP)

(73) Assignee: Nippon Soda Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/147,847

(22) PCT Filed: Sep. 18, 1997

(86) PCT No.: PCT/JP97/03293

§ 371 Date: Mar. 19, 1999

§ 102(e) Date: Mar. 19, 1999

(87) PCT Pub. No.: WO98/12232

PCT Pub. Date: Mar. 26, 1998

(30) Foreign Application Priority Data

Sep. 19, 1996 (JP) ................................... 8-269307

(51) Int. Cl.[7] .............. C08J 3/28; C08L 63/00; C08F 2/50; C08F 116/12

(52) U.S. Cl. ................ 522/25; 522/30; 522/70; 522/81; 522/168; 522/170; 522/181

(58) Field of Search ............... 522/25, 30, 26, 522/50, 52, 70, 69, 68, 81, 83, 168, 170, 181

(56) References Cited

U.S. PATENT DOCUMENTS

| | | | |
|---|---|---|---|
| 4,394,403 | 7/1983 | Smith | 427/42 |
| 4,548,890 | * 10/1985 | Dickinson et al. | |
| 4,659,649 | * 4/1987 | Dickiinson et al. | |
| 5,055,439 | * 10/1991 | Allen et al. | 502/158 |
| 5,302,725 | * 4/1994 | Kaji et al. | 548/479 |
| 5,318,808 | * 6/1994 | Crivello et al. | 531/880 |
| 5,395,734 | * 3/1995 | Vogel et al. | 430/270.1 |
| 6,054,501 | * 4/2000 | Taniguchi et al. | |
| 6,093,753 | * 7/2000 | Takahashi et al. | |

FOREIGN PATENT DOCUMENTS

| | | |
|---|---|---|
| 1516312 | 7/1978 | (GB) . |
| 1516351 | 7/1978 | (GB) . |
| 1516352 | 7/1978 | (GB) . |
| 1516511 | 7/1978 | (GB) . |
| 50-151996 | 12/1975 | (JP) . |
| 50-151997A | 12/1975 | (JP) . |
| 50-158680 | 12/1975 | (JP) . |
| 9-118663 | 5/1997 | (JP) . |
| 9-176112 | 7/1997 | (JP) . |

* cited by examiner

*Primary Examiner*—Susan W. Berman
(74) *Attorney, Agent, or Firm*—Jacobson Holman, PLLC

(57) ABSTRACT

The present invention is directed to a photocatalytic composition which comprises at least one compound selected from a group consisting of polycyclic aromatic compounds and carbazole derivatives, both of which contain as substitutes at least any of hydroxy group, optionally-substituted aralkyloxy group or alkoxy group and having an UV absorption spectrum at a wavelength longer than 330 nm, and at least one aryl onium salt selected from a group consisting of diphenylalkylsul fonium salts, dinaphthylalkylsulfonium salts, triphenylsulfonium salts, diphenyliodonium salts, phenylnaphthyliodonium salts and dinaphthyliodonium salts, those which perform as a catalyst for cationic photopolymerization.

The photocatalytic composition according to the present invention can be cured by admixing it with a cationically-polymerizable compound in the presence of an actinic radiation, such as light, electron beam and X-ray. Furthermore, as the photocatalytic composition can be cured under light of which wavelength is longer than 330 nm, where triphenylsulfonium salts and diphenyliodonium salts have either no or very little absorption spectrum, curing speed of the clear composition tend to be remarkably accelerated, while the photocuring of the composition containing an additive such as a pigment can be achieved effectively. Therefore, the photocatalytic composition of the present invention is suitably applicable to photocurable coating materials, adhesives, inks and photoresist, photosensitive resins for stereolithography, and so on.

6 Claims, No Drawings

PHOTOCATIONICALLY POLYMERIZABLE COMPOSITION COMPRISING A POLYCYCLIC AROMATIC COMPOUND

FIELD OF INVENTION

The present invention is directed to a sensitized photocatalytic composition, and more specifically to a photocatalytic composition for cationic photopolymerization to be used for photocurable cationically-polymerizable compounds. The photocatalytic composition according to the present invention can cure cationically-polymerizable compounds when it is mixed with said compounds and is irradiated with an actinic radiation such as light, electron beam or X-ray, and because of its excellent property in the photosensitivity to long wavelength light, the composition is suitably applicable to photocurable coating materials, adhesives, inks, and photoresists, photosensitive resins for photomodeling, and so on.

BACKGROUND ART

As examples for aryl onium salts usable in the present invention, the ones disclosed in Japanese Patent Laid-opened Nos. Sho 50-151997, Sho 50-158680 and Sho 50-151996 are known, and wherein it is described that these salts can be used as a catalyst capable of curing cationically-polymerizable compounds, such as epoxy compounds, in the presence of any of light, electron beam and radiation, such as X-ray.

As said aryl onium salts have almost no absorbing property for rays having a wavelength longer than 360 nm, which rays are considered as effective range for the curing with ultraviolet radiation, it is known that photocatalytic activity tend to be remarkably deteriorated when such salts are used for photomodeling using lasers having a long wavelength and for photocurable compositions using additives, such as pigments. In particular, such deterioration is seriously disadvantageous in case of photocurable compositions which contain great amount of white pigments, such as titanium dioxide, of which absorption spectrum coincides with the UV absorption spectrum of aryl onium salts. For solving such a problem, investigation was made on use of sensitizers, thereby it is reported that compounds, such as phenothiadine, anthracene and perilene, are useful as such sensitizers for improving photocurable property. However, it is insufficient yet to improve the photocurable property by using said sensitizers mentioned above in case of photocurable compositions using additives, such as pigments.

Also, in case of an aryl iodonium salt represented by diphenyl iodonium salt, of which pair anions are SbF6 and an anion other than B(C6F5), such as PF6, it is known that photocurable property is found to be very bad when such a salt is used for a clear coating composition.

Aiming at solving the problems as described above, it is an objective of the present invention to provide a photocatalytic composition for cationic photopolymerization which can sufficiently cure even aryl iodonium salts represented by diphenyl iodonium salts of which pair aninons contain an anion, such as PF6, and compositions containing additives, such as pigments, within a short time, and is capable of providing excellent physical properties to the products cured by the inventive photocatalytic composition.

DISCLOSURE OF THE INVENTION

For aiming at solving the problems described above, the inventors of the present invention had keenly studied to find out a photocatalytic composition which can provide a solution for such problems by using a specific sensitizer in the photocatalytic composition.

Now, the present invention is further explained in detail in the following.

The present invention is directed to a photocatalytic composition comprising at least one compound, which is selected from a group consisting of polycyclic aromatic compounds and carbazole derivatives, both of which contain as substitutes at least any of hydroxy group, optionally-substituted aralkyloxy group or alkoxy group, and having an. UV absorption spectrum at a wavelength longer than 330 nm, and more specifically to a photocatalytic composition containing at least one compound selected from a group consisting of polycyclic aromatic compounds and carbazole derivatives, both of which contain as substituents at least one of hydroxy group, optionally-substituted aralkyloxy group or alkoxy group, and having an UV absorption spectrum at a wavelength longer than 330 nm and at least one aryl onium salt selected from a group consisting of diphenylalkylsulfonium salts, dinaphthylalkylsulfonium salts, triphenylsulfonium salts, diphenyliodonium salts, phenylnaphthyliodonium salts and dinaphthyliodonium salts, those which perform as a catalyst for cationic photopolymerization.

The compounds specified in the present invention are compounds selected from a group consisting of polycyclic aromatic compounds and carbazole derivatives, those which contain as substituents at least one of hydroxy, optionally-substituted aralkyloxy and alkoxy, and each of the compounds have an UV absorption spectrum at a wavelength longer than 330 nm and work mainly as a sensitizer for a catalyst to be used for cationic photopolymerization.

As examples for the aryl onium salts usable for the present invention, the ones disclosed in Japanese Patent Laid-opened Nos. Sho 50-15199 Gazette, Sho 50-158680 Gazetter and Sho 50-151996 Gazette can be given, and out of those examples, it is preferable to use particularly diphenylalkylsulfonium salts, dinaphthylalkylsulfonium salts, triphenylsulfonium salts, diphenyliodonium salts, phenylnaphthyliodonium salts, dinaphthyliodonium salts and derivatives of all these salts mentioned above.

For pair anions, any non-nucleophilic pair anions can be used irrespective of their types.

As examples for the sulfonium salts described above, the following compounds can be given.

In the following illustrated compounds, X represents an anion residue, and $B(C_6F_5)$, $SbF_6$, $AsF_6$, $PF_6$, $BF_4$ and the like can be given as examples for such residues.

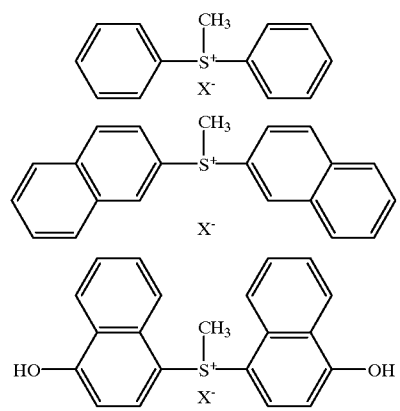

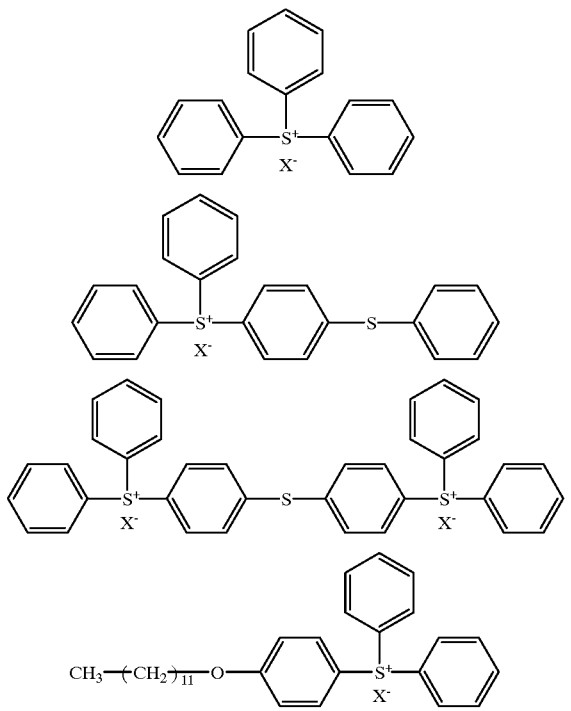

It is particularly a diaryliodonium salt compound that shows its remarkable sensitizing effect when it is combined with the photocatalytic composition according to the present invention.

As examples for said diaryliodonium salts, diphenyliodonium salts, phenylnaphthyliodonium salts and dinaphthyliodonium salts, those which contain phenyl and naphthyl being optionally substituted with alkyl, such as methyl, ethyl, propyl, isopropyl, butyl, isobutyl, t-butyl, pentyl, hexyl, and decyl; cycloalkyl, such as cyclohexyl; alkoxy, such as methoxy, ethoxy, propoxy, butoxy, hexyloxy, decyloxy, and dodecyloxy; halogeno, such as fluorine, chlorine, bromine and iodine; carbonyl, such as benzoyl; phenyl, nitro and the like can be given, whereas as examples for the non-nucleophilic pair anions, $B(C_6F_5)$, $SbF_6$, $AsF_6$, $PF_6$, $BF_4$ and the like can be given.

As examples for the diallyliodonium salts, compounds as shown below can be given, wherein X represents an anion residue, and $B(C_6F_5)$, $SbF_6$, $AsF_6$, $PF_6$, $BF_4$ and the like can be given as the examples thereof.

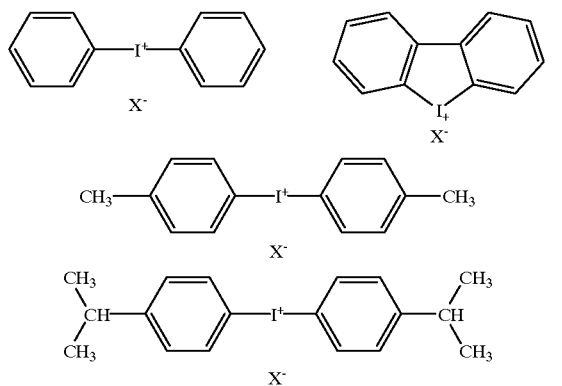

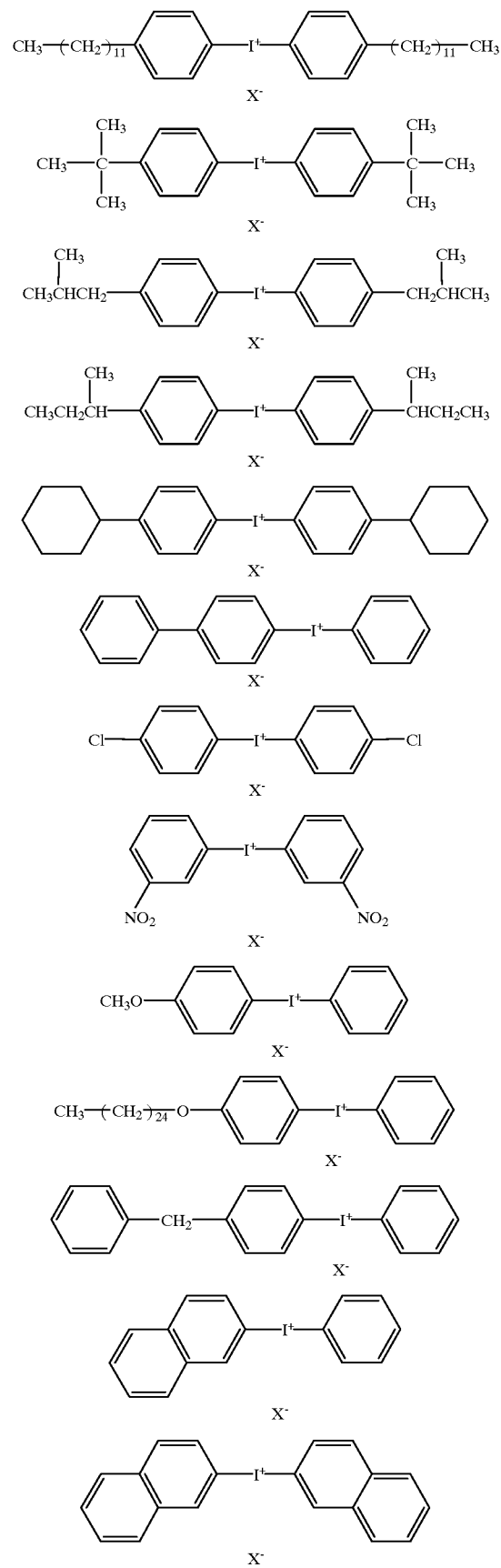

-continued

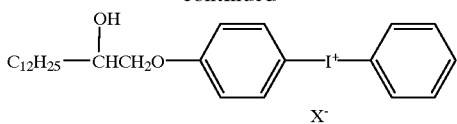

The sensitizer used in the present invention is either a polycyclic aromatic compound or a carbazole derivative, which has an UV absorption spectrum at a wavelength longer than 330 nm and contains as substituents at least any of hydroxy, optionally-substituted aralkyloxy and alkoxy.

As examples for the polycyclic aromatic compound, it is preferable to use any of naphthalene derivatives, anthracene derivatives, chrysene derivatives and phenanthrene derivatives. As alkoxy as substituents, the ones containing 1–18 carbon atoms are preferable, and particularly the ones containing 1–8 carbon atoms are more preferable. As aralkyloxy, the ones containing 7–10 carbon atoms are preferable, and particularly the ones containing 7–8 carbon atoms, such as benzyloxy and phenethyloxy, are more preferable.

As examples for the sensitizer usable in the present invention, carbazole derivatives, such as carbazole, N-ethylcarbazole, N-vinylcarbazole and N-phenylcarbazole; naphthalene derivatives, such as 1-naphthol, 2-naphthol, 1-methoxynaphthalene, 1-stearyloxynaphthalene, 2-methoxynaphthalene, 2-dodecyloxynaphthalene, 4-methoxy-1-naphthol, glycidyl-1-naphthyl ether, 2-(2-naphthoxy)ethyl vinyl ether, 1,4-dihydroxynaphthalene, 1,5-dihydroxynaphthalene, 1,6-dihydroxynaphthalene, 2,7-dihydroxynaphthalene, 2,7-dimethoxynaphthalene, 1,1'-thiobis(2-naphthol), 1,1'-bi-2-naphthol, 1,5-naphthyldiglycidyl ether, 2,7-di(2-vinyloxyethyl)naphthyl ether, 4-methoxy-l-naphthol, ESN-175 (an epoxy resin manufactured by Shin-nittetsu Chemical Co., Ltd.) and its series, and condensates of a naphthol derivative and formalin; anthracene derivatives, such as 9,10-dimethoxyanthracene, 2-ethyl-9,10-dimethoxyanthracene, 2-t-butyl-9,10-dimethoxyanthracene, 2,3-dimethyl-9,10-dimethoxyanthracene, 9-methoxy-10-methylanthracene, 9,10-diethoxyanthracene, 2-ethyl-9,10-diethoxyanthracene, 2-t-butyl-9,10-diethoxyanthracene, 2,3-dimethyl-9,10-diethoxyanthracene, 9-ethoxy-10-methylanthracene, 9,10-dipropoxyanthracene, 2-ethyl-9,10-dipropoxyanthracene, 2-t-butyl-9,10-dipropoxyanthracene, 2,3-dimethyl-9,10-dipropoxyanthracene, 9-isopropoxy-10-methylanthracene, 9,10-dibenzyloxyanthracene, 2-ethyl-9,10-dibenzyloxyanthracene, 2-t-butyl-9,10-dibenzyloxyanthracene, 2,3-dimethyl-9,10-dibenzyloxyanthracene, 9-benzyloxy-10-methylanthracene, 9,10-di-α-methylbenzyloxyanthracene, 2-ethyl-9,10-di-α-methylbenzyloxyanthracene, 2-t-butyl-9,10-di-α-methylbenzyloxyanthracene, 2,3-dimethyl-9,10-di-α-methylbenzyloxyanthra cene, 9-α-methylbenzyloxy)-10-methylanthracene, 9,10-di(2-hydroxyethoxy)anthracene and 2-ethyl-9,10-di(2-carboxyethoxy)anthracene; chrysene derivatives, such as 1,4-dimethoxychrysene, 1,4-diethoxychrysene, 1,4-dipropoxychrysene, 1,4-dibenzyloxychrysene and 1,4-di-α-methylbenzyloxychrysene; and phenanthrene derivatives, such as 9-hydroxyphenanthrene, 9,10-dimethoxyphenanthrene and 9,10-diethoxyphenanthrene, can be given.

Among the derivatives as exemplified above, it is preferable to use 9,10-dialkoxyanthracene derivatives being optionally-substituted with alkyl which particularly contains 1–4 carbon atoms, and it is further preferable if alkoxy contained therein is either methoxy or ethoxy.

As the cationically-polymerizable compound used for the present invention, any of commonly-known monomers, oligomers and polymers, which have cationically-polymerizable groups, can be used without any limitation, and the compounds as described below can be given as such examples. (a) Among vinyl compounds, styrene compounds, such as styrene, α-methylstyrene, p-methoxystyrene and p-t-butoxystyrene; alkyl vinyl ethers, such as methyl vinyl ether, n-butyl vinyl ether, ethyl vinyl ether, isobutyl vinyl ether, cyclohexyl vinyl ether, 2-chloroethyl vinyl ether, 2-phenoxyethyl vinyl ether, 2-hydroxyethyl vinyl ether, 4-hydroxybutyl vinyl ether, stearyl vinyl ether and 2-acetoxyethyl vinyl ether; alkenyl vinyl ethers, such as allyl vinyl ether, 2-metacryoyloxyethyl vinyl ether and 2-acryoyloxyethyl vinyl ether; aryl vinyl ethers, such as phenyl vinyl ether and p-methoxyphenyl vinyl ether; cationically-polymerizable nitrogen-containing compounds, such as N-vinyl carbazole and N-vinyl pyrrolidone; and multifunctional vinyl compounds, such as butanediol divinyl ether, triethyleneglycol divinyl ether, cyclohexanediol divinyl ether, 1,4-benzenedimethanol divinyl ether, hydroquinone divinyl ether and sazolcinol divinyl ether, can be given as examples for said cationically-polymerizable compounds.

(b) Among epoxy compounds, monofunctional monomers, such as phenylglycidyl ether, p-t-butyl phenylglycidyl ether, butylglycidyl ether, 2-ethyl hexylglycidyl ether, allylglycidyl ether, 1,2-butylene oxide, 1,3-butadiene monoxide, 1,2-dodecylene oxide, epichlorohydrine, 1,2-epoxydecane, ethylene oxide, propylene oxide, styrene oxide, cyclohexene oxide, 3-metacryloyloxymethyl cyclohexene oxide, 3-acryloyloxymethyl cyclohexene oxide and 3-vinylcyclohexene oxide and multifunctional epoxy compounds, such as 1,1,3-tetradecadiene dioxide, lemonene dioxide, 3,4-epoxycyclohexylmethyl-(3,4-epoxycyclohexyl) carboxylate, di(3,4-epoxycyclohexyl) adipeate, bisphenol A-type epoxy resin, bisphenol F-type epoxy resin, o-, m- and p-cresol novolac epoxy resins, phenol novolac epoxy resin and polyglycidyl ether of polyhydric alcohol, can be given as examples for the cationically-polymerizable compounds.

(c) Among bicyclo-ortho-esters, 1-phenyl-4-ethyl-2,6,7-trioxabicyclo[2,2,2]octane, 1-ethyl-4-hydroxymehtyl-2,6,7-trioxabicyclo[2,2,2]octane and the like can be given as examples for the cationically-polymerizable compounds.

(d) Among spiro-orthocarbonates, 1,5,7,11-tetraoxaspiro[5,5]undecane, 3,9-dibenzyl-1,5,7,11-tetraoxaspiro[5,5]undecane, 1,4,6-trioxaspiro[4,4]nonane, 2-methyl-1,4,6-trioxaspiro[4,4]nonane, 1,4,6-trioxaspiro[4,5]dec an and the like can be given as examples for the cationically-polymerizable compounds.

(e) Among oxetane compounds, 3,3-dimethyloxetane, 3,3-bis(chloromethyl) oxetane, 2-hydroxymethyloxetane, 3-methyl-3-oxetane methanol, 3-methyl-3-methoxymethyloxetane, 3-ethyl-3-phenoxymethyloxetane, resolcinol bis(3-methyl-3-oxetanylethyl)ether, m-xylylene bis(3-ethyl-3-oxetanylethyl ether) and the like can be given as examples for the cationically-polymerizable compounds.

These compounds as decribed above can be used either alone or in combination of 2 or more thereof.

In the present invention, the combining ratio for an arylonium salt and a sensitizer can be fixed arbitrarily, however it is preferable to use 0.1–10 parts by weight of a sensitizer relative to 1 part by weight of an aryl onium salt, and more preferable to use 0.3–5 parts by weight of a sensitizer relative to 1 part by weight of an aryl onium salt. Sensitizing activity of the composition of the present invention deteriorates if the amount of a sensitizer relative to that of an aryl onium salt is insufficient, while the property of a cured-product gets worse if the amount of a sensitizer is too much relative to that of an aryl onium salt. Provided, this phenomenon described above would not be applied for a composition wherein the sensitizer used is one which contains a reactive group such as epoxy group or vinyl ether group, for example, ESN-175 (an epoxy resin manufactured by Shin-nittetsu Chemical Co., Ltd.) and 2-(2-naphthoxy) ethyl vinyl ether.

In the present invention, for combining an aryl onium salt and a sensitizer, it is preferable to use 9,10-dialkoxyanthracene as a sensitizer if a sulfonium compound is used as an aryl onium salt. Whereas, if an iodonium salt is used as an aryl onium salt, it is preferable to use any of carbazole derivatives, naphthol derivatives, alkoxynaphthalene derivatives, and phenanthrene derivatives for a clear composition, while it is preferable to use 9,10-dialkoxyanthracene for a pigment-containing composition.

A curable composition using the catalytic composition according to the present invention can be cured easily in the presence of light.

As a light source, low-pressure mercury lamps, medium-pressure mercury lamps, high-pressure mercury lamps, extra-high pressure mercury lamps, metal halide lamps, xenon lamps, carbon arc lamps, etc. can be used. In addition, laser light, such as semiconductor laser, algon laser and He-Cd laser, can be also used. In particular, a metal halide lamp which contains gallium is preferably used when it is used for curing thick films and a photocatalytic composition containing a pigment, such as titanium dioxide.

The curable composition using the catalytic composition according to the present invention can be cured easily in the presence of any of ionizing radiations, α rays, β rays, γ rays, neutron beam and accelerating electron beam.

BEST MODE FOR CARRYING OUT THE INVENTION

Now, the present invention is further described in detail with referring the following examples, however, it should be noted that the scope of the present invention shall not be limited to the one which is described in the following examples.

Test on Photocuring Property I (Using a clear composition)

By admixing both 1 part of an aryl onium salt as the pure material and 1 part of a sensitizer with 100 parts of UVR-6110 (an alicyclic epoxy manufactured by UCC), a composition was prepared. The composition was then coated onto a tin plate in a thickness of 5 μm and subsequently subjected to photocuring process under a condition as described below. After carrying out such photocuring, the composition of which cured-film has no tack thereon was shown with a mark of ○, whereas the one having tacks thereon was shown with a mark of X to differentiate in Table 1.

Condition employed:

UV Irradiating Apparatus: Belt Conveyer-type UV Irradiator (Manufactured by Eye Grafics)

Lamp: Focusing-type 80W High-pressure Mercury Lamp, 1 lamp

Distance for Irradiation: 10 cm (as focal distance)

TABLE 1

| Aryl onium salt | Sensitizer | Speed of Belt Conveyer (meters/min) | Photocuring Property Test I |
|---|---|---|---|
| 4,4'-Di-t-butyl-diphenyl-iodoniumhexafluorophosphonate | N-Ethylcarbazole | 80 | ○ |
| | 1-Methoxy-4-naphthol | 80 | ○ |
| | 1-Naphthol | 80 | ○ |
| | 2-Methoxynaphthalene | 80 | ○ |
| | 9,10-Dimethoxyphenanthrene | 80 | ○ |
| | ESN-175 | 80 | ○ |
| | No use | 20 | X |

Test on Photocuring Property II (Using a pigment-containing composition)

3 parts of aryl onium salt as the pure material and 1 part of a sensitizer were admixed together with 100 parts of UVR-6110 (an alicyclic epoxy manufactured by UCC) and 100 parts of titanium dioxide (CR-58, manufactured by Ishihara Sangyo Kaisha) to prepare a composition. The composition was then coated onto a tin plate in a thickness of 5 μm and subsequently subjected to photocuring process under a condition as described below. After carrying out such photocuring, the composition of which internal part having also been cured was classified with a mark of ○, whereas the composition of which internal part was not cured was classified with a mark of X to diffentiate in Table 2.

Condition employed:

UV Irradiating Apparatus: Belt Conveyer-type UV Irradiator (Manufactured by Eye Grafics)

Lamp: Focusting-type 160W Gallium-containing matal halide Lamp, 1 lamp

Distance for Irradiation: 10 cm (as focal distance)

Speed of Belt Conveyer: 30 m/min.

TABLE 2

| Aryl onium salt | Sensitizer | Photocuring Property Test II |
|---|---|---|
| UVI 6990 (Manufactured by UCC) | 2-Ethyl-9,10-dimethoxyanthracene | ○ |
| | Anthracene | X |
| | Phenothiazine | X |
| | No use | X |
| S,S,S',S'-tetraphenyl-S,S'-(4,4'-thiodiphenyl)disulfonium=Bishexafluorophosphonate | 2-Ethyl-9,10-dimethoxyanthracene | ○ |
| | Anthracene | X |
| | Phenothiazine | X |
| | No use | X |
| 4,4'-Di-t-butyl-diphenyl-iodonium=Hexafluorophosphonate | 2-Ethyl-9,10-dimethoxyanthracene | ○ |
| | Anthracene | X |
| | Phenothiazine | X |
| | No use | X |

Industrial Use of the Invention:

The photocatalytic composition according to the present invention can be cured by admixing it with a cationically-polymerizable compound in the presence of an actinic radiation, such as light, electron beam and X-ray. Furthermore, as the photocatalytic composition can be cured under light of which wavelength is longer than 330 nm, where triphenylsulfonium salts and diphenyliodonium salts have either no or very little absorption, curing speed of the clear composition tend to be remarkably accelerated, while the photocuring of the composition containing an additive such as a pigment can be achieved effectively. Therefore, the photocatalytic composition of the present invention is suitably applicable to photocurable coating materials, adhesives, inks and photoresist, photosensitive resins for stereolithography, and so on.

What is claimed is:

1. A photocatalytic composition comprising optionally substituted 9,10-dialkoxyanthracene or optionally substituted 9,10-diaralkyloxyanthracene, one aryl onium salt selected from the group consisting of a diphenylalkylsulfonium salt, a dinaphthylalkylsulfonium salt, a triphenylsulfonium salt, a diphenyliodonium salt, a phenylnaphthyliodonium salt and a dinaphthyliodonium salt, a titanium dioxide pigment, and a cationically polymerizable compound selected from the group consisting of an alicyclic epoxy compound, a vinyl ether compound, an oxetane compound and mixtures thereof.

2. The photocatalytic composition according to claim 1, wherein each alkoxy of the dialkoxy group of the 9,10-dialkoxyanthracene has 1–8 carbon atoms and each aralkyloxy of the diaralkyloxy group of the 9,10-diaralkyloxyanthraene has 7–8 carbon atoms.

3. The photocatalytic composition according to claim 1, wherein the optionally substituted anthracene is 9,10-dimethoxyanthracene, 9,10-diethoxyanthracene, 9,10-dibenzyloxyanthracene or mixtures thereof.

4. The photocatalytic composition according to claim 1 wherein the optionally substituted anthracene is 2-ethyl-9,10-dimethoxyanthracene.

5. A photocuring method of photocuring a photocurable composition according to claim 3, comprising exposing the photocurable composition to a light source from a metal halide lamp which contains gallium.

6. A composition according to claim 1 which is photocurable on exposure to a light source from a gallium-containing metal halide lamp.

* * * * *